United States Patent
Chang

Patent Number: 5,943,567
Date of Patent: Aug. 24, 1999

[54] METHOD FOR PREPARING POLYSILICON LOAD

[75] Inventor: Ming-Lun Chang, Hsinchu, Taiwan

[73] Assignee: Winbond Electronics Corp, Hsinchu, Taiwan

[21] Appl. No.: 09/226,811

[22] Filed: Jan. 6, 1999

[51] Int. Cl.⁶ ............................................. H01L 21/8244
[52] U.S. Cl. .......................... 438/238; 438/381; 438/382
[58] Field of Search .................................. 438/238, 241, 438/381–382; 257/903–904

[56] References Cited

U.S. PATENT DOCUMENTS 5,705,418  1/1998  Liu .
5,721,166  2/1998  Huang et al. ........................... 438/238

*Primary Examiner*—Jey Tsai
*Attorney, Agent, or Firm*—W. Wayne Liauh

[57] ABSTRACT

A method for fabricating a load device on an SRAM is provided which substantially increases the effective length of its load device without increasing the cell size. This method includes the steps of: (1) depositing an interpoly dielectric layer on a wafer surface; (2) depositing a first oxide layer on the interpoly dielectric layer; (3) using a photography technique to form at least one first oxide stripe from the interpoly dielectric layer in a direction perpendicular to the direction of the polysilicon load; (4) depositing a second oxide layer on and around the first oxide stripe, then etching back the second oxide layer to form a second oxide spacer on the sidewalls of the first oxide stripe; (5) using a selective etching technique to etch the first oxide stripe, leaving the second oxide spacer on the wafer surface; (6) using a photolithography technique and masked dopant-implantation to form a polysilicon layer on the surface, the polysilicon layer contains a highly doped connector region and an undoped or lightly doped load region. The load region is formed in a direction perpendicular to the second oxide stripe and conformed to the profile of the second oxide stripe so as to assume a three-dimensional heaved structure on top thereof and provide an enhanced effective length.

14 Claims, 3 Drawing Sheets

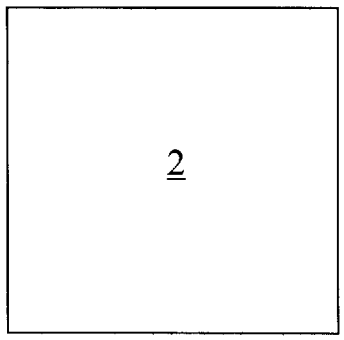
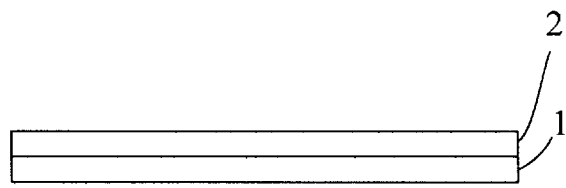
FIG. 1B          FIG. 1A
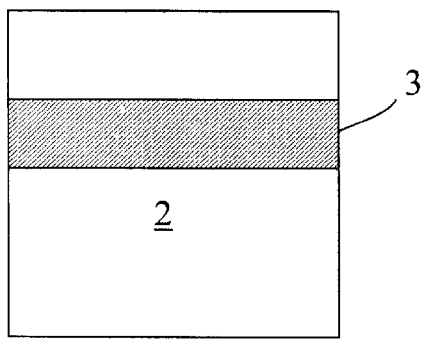
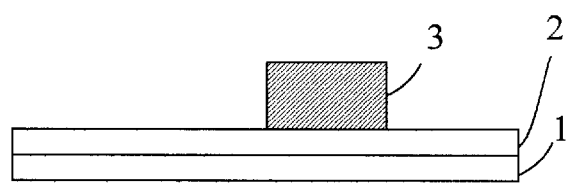
FIG. 2B          FIG. 2A
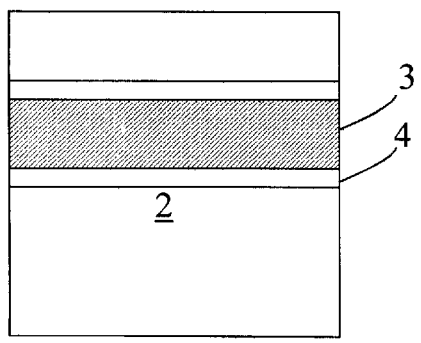
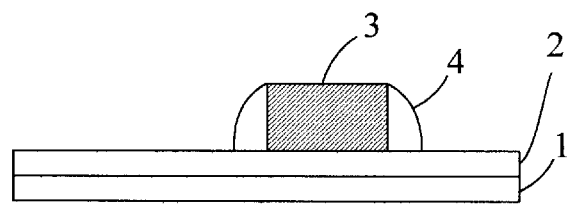
FIG. 3B          FIG. 3A

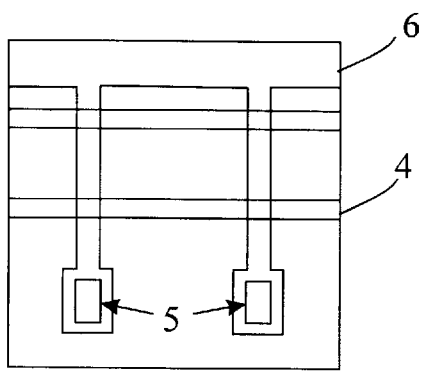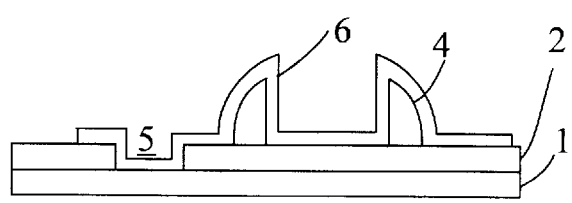
FIG. 7B          FIG. 7A
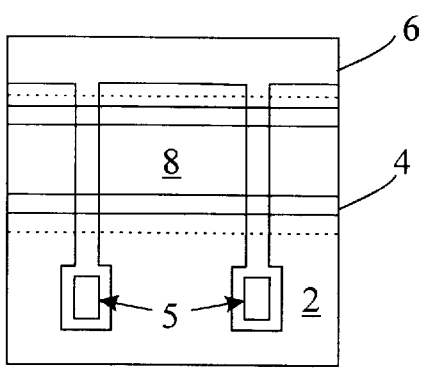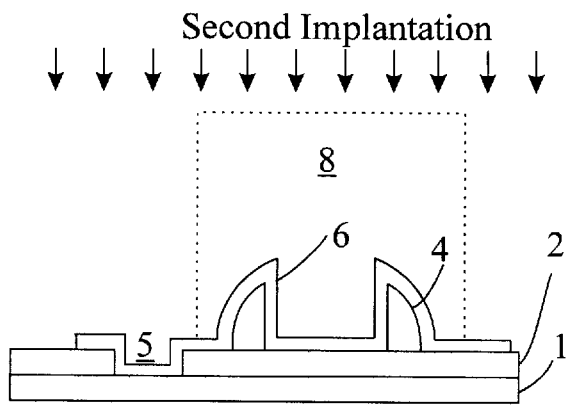
FIG. 8B          FIG. 8A
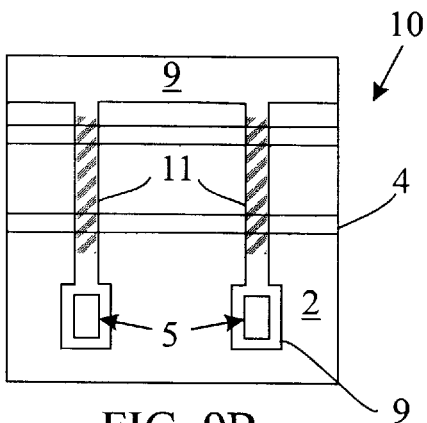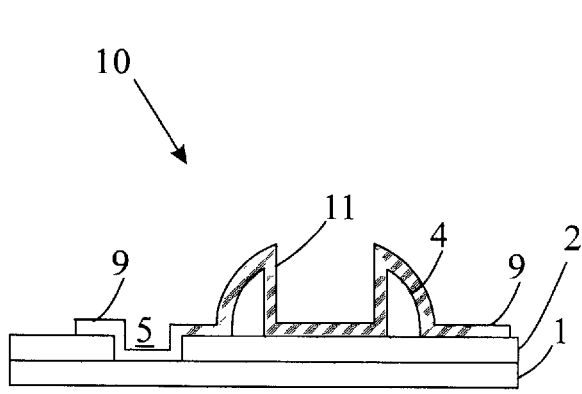
FIG. 9B          FIG. 9A

METHOD FOR PREPARING POLYSILICON LOAD

FIELD OF THE INVENTION

The present invention relates to a method for preparing SRAMS which contain polysilicon load devices with enhanced effective length relative to their actual physical dimension. More specifically, the present invention relates to a method for preparing polysilicon loads in a 4T (four-transistor) SRAM (static random access memory) cell which allows the effective length of the polysilicon loads to be substantially increased without the need to increase the cell size. The present invention also relates to the improved 4T SRAM cells which contain polysilicon loads with enhanced effective length relative to conventional SRAM cells with similar cell dimension. With the technique disclosed in the present invention, SRAM manufacturers will be able to further reduce the cell size with currently existing photolithography techniques and without incurring large capital investments.

BACKGROUND OF THE INVENTION

A 4T (four-transistor) SRAM (static random access memory) cell contains four transistors and two load devices (or "loads") within each memory cell. Typically, the transistors are MOSFETs (MOS field effect transistors) and the loads are polysilicon transistors that are undoped or lightly doped to provide a high electrical resistance so as to serve as an insulator. Conventionally, the loads are formed by first depositing a polysilicon film on the substrate, followed by high-energy blanket implantation using an appropriate dopant to obtain the desired resistance intended for the loads. After the blanket implantation, a photolithography technique is applied to form a polysilicon line pattern which encompasses the portion of the polysilicon film intended to be connectors. A high-density dopant implantation is then applied to the connector area (which process is often called "connector implantation") to significantly reduce its resistance. The undoped area during the second, masked, implantation remains at relatively high resistance and serves as loads between respective pairs of connectors.

The resistance of loads is determined by the amount of dopant implanted during the first, or blanket, implantation, the thickness of the polysilicon film, the width and length of the load lines, etc. Conventionally, in order to obtain high enough load resistance, the circuit design engineers have to reduce the polysilicon film thickness, increase the load length, or reduce the load width, or combinations thereof. However, as the cell size of the SRAM continues to be reduced, the conventional approach is facing serious problems. One of the major obstacles is that, due to the outdiffusion of dopants from the connector areas, the effective length of the load will be reduced to an even greater extent relative to its actual length as the actual length of the load becomes shorter. While the load resistance may be increased by reducing the width of the load, the minimum width, however, is limited by the underlying photolithography technique. Upgrading the photolithography process can be a very expensive undertaking which will require large capital investments. Thus, the inability to provide adequate load resistance under the currently existing techniques has become one of the major remaining problems in attempts to further reduce SRAM cell size.

The technique to increase the effective length of an SRAM load without increasing its physical dimension as disclosed in the present invention has not been taught or suggested in any prior art references. However, several issued patents discussed the fabrication of 4T SRAM in general. They are briefly discussed below.

U.S. Pat. No. 5,605,853 disclosed an integrated process for forming a 4T SRAM and a floating gate memory, with logic, on the same integrated circuit. One of the key elements of the '853 patent is that, through its various process elements as recited in its claims, the logic salicide and the SRAM local interconnect are formed simultaneously and that the floating memory and logic on the same substrate in which gate-to-source/drain contacts are butted contacts having reduced contact resistance. The '853 patent never discussed the need to increase the effective length of the load device.

U.S. Pat. No. 5,700,711 disclosed a method for manufacturing a load shield structure which is formed over each of the undoped or lightly doped polysilicon load devices of a 4T SRAM cell. The method includes the steps of: (1) forming a polycrystalline silicon structure over a memory cell of an SRAM device; (2) forming a load mask over the polycrystalline silicon structure covering a region where a load structure is to be formed, the load mask being patterned using a master load mask; (3) doping regions of the polycrystalline silicon structure not covered by the load mask; (4) forming a blanket dielectric layer over the SRAM device covering the polycrystalline silicon structure and other exposed surfaces of the SRAM device; and (5) forming a dummy conductor structure on the blanket dielectric layer. The purpose of the dummy conductor structure is to protect the polycrystalline silicon load resistor during subsequent processing steps. Again, the '711 patent did not teach or suggest any means to increase the effective length of the SRAM load devices.

SUMMARY OF THE INVENTION

The primary object of the present invention is to develop a method to fabricate SRAMs with enhanced effective length, and thus increased electrical resistance, of the load devices without increasing the cell size of the SRAM. More specifically, the primary object of the present invention is to develop a method that will enhance the effective length, and thus the electrical resistance, of the load devices in a 4T SRAM using currently available photolithography techniques. The method disclosed in the present invention can eliminate one of the major bottlenecks in attempts to further scale down the size of SRAM cells without incurring major process and equipment upgrades.

One of the key elements of the present invention is to form a bump on the path of the load device, so as to cause the formation of a three-dimensional heaved load structure on the SRAM. The three-dimensional structure substantially increases the effective length of a load device without increasing the cell size. Due to the effect of out-diffusion of dopants from the connector region into the load region on the same polysilicon film, the effective length of a load device will be reduced to a more significant extent with a relatively short load device. Thus, the method disclosed in the present invention will be most advantageous for the fabrication of SRAMs with reduced cell size.

The method disclosed in the present invention can be summarized as comprising the following steps:

(1) Depositing an interpoly dielectric layer on a wafer surface;

(2) Depositing a first oxide layer on the interpoly dielectric layer;

(3) Using a photography technique to form one or more first oxide stripes from the interpoly dielectric layer in a direction perpendicular to the direction of the polysilicon load;

(4) Depositing a second oxide layer on and around the first oxide stripes, then etching back the second oxide layer to form a second oxide spacer on the sidewalls of the first oxide stripes;

(5) Using a selective etching technique to etch the first oxide stripe, leaving the second oxide spacer on the wafer surface;

(6) Using a photolithography technique in conjunction with a masked ion implantation technique to form a polysilicon layer on the surface, the polysilicon layer contains a connector region and a load region, the load region is formed in a direction perpendicular to the second oxide stripe and conformed to the profile of the second oxide stripe so as to assume a three-dimensional structure and provide an enhanced effective length.

BRIEF DESCRIPTION OF THE DRAWING

The present invention will be described in detail with reference to the drawing showing the preferred embodiment of the present invention, wherein:

FIGS. 1A and 1B are an illustrative schematic side view and a rotated (by 90 degrees) top view, respectively, showing that an interpoly dielectric layer is deposited on a wafer surface.

FIGS. 2A and 2B are an illustrative schematic side view and a rotated top view, respectively, showing that a pair of first oxide stripes are formed on the interpoly dielectric layer.

FIGS. 3A and 3B are an illustrative schematic side view and a rotated top view, respectively, showing that a second oxide spacer is formed on the sidewalls of the first oxide stripes.

FIGS. 7A and 7B are an illustrative schematic side view and a rotated top view, respectively, showing that a connector region and a load region are formed from the polysilicon layer using a photolithography technique.

FIGS. 8A and 8B are an illustrative schematic side view and a rotated top view, respectively, showing that the connector region is further doped under a masked, second, implantation procedure using a photoresist.

FIGS. 9A and 9B are an illustrative schematic side view and a rotated top view, respectively, showing the SRAM of the present invention having a double-heaved load device for enhanced effective length and thus enhanced load resistance.

DETAILED DESCRIPTION OF PREFERRED EMBODIMENTS

Figure 4B:
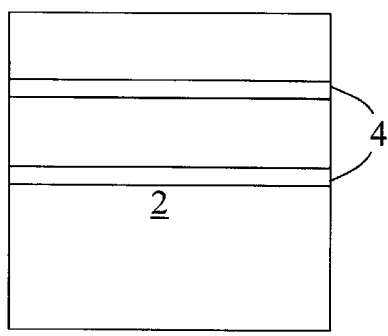
FIGS. 4A and 4B are an illustrative schematic side view and a rotated top view, respectively, showing that the first oxide stripe is removed by selective oxide etching leaving the second oxide spacer on the wafer surface.

The present invention discloses a novel method for fabricating SRAMs with enhanced effective length, and thus increased electrical resistance, of the load devices without increasing the cell size of the SRAM. The method disclosed in the present invention is most advantageous for fabricating 4T SRAMs containing a polysilicon layer which includes a highly doped connector region and an undoped or lightly doped load region, which is typically called a load device. The SRAM of the present invention contains one or more dielectric bumps on the path of the load device, so as to cause the load device, which is deposited on top the bumps, to be heaved and thus assume a three-dimensional structure on the SRAM. The three-dimensional structure of the load device of the present invention substantially increases the effective length of the load device without increasing cell dimension. As it was discussed earlier, due to the effect of out-diffusion of dopant molecules from the connector region into the load region on the same polysilicon film, the effective length of a load device will be reduced to a more significant extent with a relatively short load device. Thus, the method disclosed in the present invention will be most advantageous for the fabrication of SRAMs with reduced cell size.

The method disclosed in the present invention can be summarized as comprising the following steps:

(1) Depositing an interpoly dielectric (IPD) layer on a wafer surface containing a finished metal layer. Preferably, the interpoly dielectric layer is an undoped TEOS layer having a thickness of about 2,000 to 5,000 Å.

(2) Depositing a first oxide layer on the interpoly dielectric layer. Preferably, the first oxide layer is a doped oxide layer such as BP-TEOS having a predetermined thickness "d". The value of d determines the heaved height and thus the total effective length of the load, and is determined by the resistance value expected of the load device. Preferably, the thickness d of the first oxide layer is between 500 and 2,000 Å.

(3) Using a photolithography technique to form one or more first doped oxide stripes from the interpoly dielectric layer in a direction perpendicular to the intended direction of the polysilicon load.

(4) Depositing a second oxide layer on and around the first doped oxide stripes, then etching back the second oxide layer, preferably using an anisotropic etching technique, to form a second oxide spacer on the sidewalls of the first dope oxide stripe. Preferably, the second oxide layer contains undoped TEOS.

(5) Using a selective etching technique to etch out the first doped oxide stripe, leaving the second oxide spacer on the wafer surface. Preferably, the selective etching is a vapor hydrofluoric (HF) selective etching, which is effective against doped oxide but is inactive with respect to undoped oxide.

(6) Using a photolithography technique to form a polysilicon layer on the surface, the polysilicon layer contains a connector region and a load region, the load region is formed in a direction perpendicular to the second oxide stripe and conformed to the profile of the second oxide stripe so as to assume a three-dimensional structure and provide an enhanced effective length. The polysilicon layer can be undoped or lightly doped. Prior to doping, one or more vial holes can be formed through the interpoly dielectric layer using a masked etching procedure.

(7) Performing implantation using a photoresist which covers the load region so as to impart electrical conductivity to the connector region. The load region is not doped to retain high resistivity.

The present invention will now be described more specifically with reference to the following example. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1A through 9A, and 1B through 9B are an illustrative schematic side views and rotated (by 90 degrees) top views, respectively, showing the main steps of fabricating the improved SRAM cells according to a preferred embodiment of the present invention. These figures are discussed in more detail below.

FIGS. 1A and 1B show that an interpoly dielectric layer 2 is deposited on a wafer surface, which contains a metal pattern 1. The interpoly dielectric layer 2 is an undoped TEOS having a thickness of about 2,000 to 5,000 Å. A first oxide layer, which is a doped BP-TEOS layer having a thickness of about 500 to 2,000 Å, is then deposited on the interpoly dielectric layer. After a masked etching, a first oxide stripe 3 is formed on the interpoly dielectric layer, as shown in FIGS. 2A and 2B.

Figure 4A:
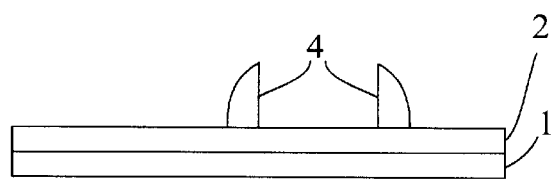

FIGS. 3A and 3B show that a second oxide spacer 4 is formed on the sidewalls of the first oxide stripe 3. The second oxide spacer 4 is formed by first depositing a second oxide layer, which contains undoped TEOS, on and around the first oxide stripe 3, then the second oxide layer is etched back using an anisotropic etching technique, to form a second oxide spacer on the sidewalls of the first doped oxide stripe. After the formation of the second oxide spacer 4, the first oxide stripe is removed by selective oxide etching leaving the second oxide spacer 4 on the wafer surface, as shown in FIGS. 4A and 4B.

Figure 5B:
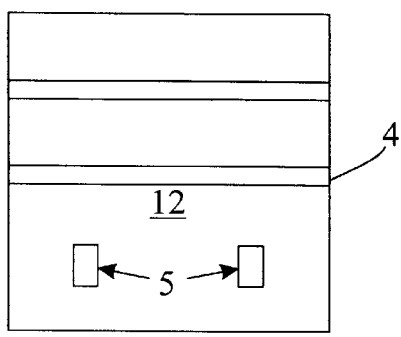
FIGS. 5A and 5B are an illustrative schematic side view and a rotated top view, respectively, showing that vials are formed through the interpoly dielectric layer utilizing a photoresist.
Figure 5A:
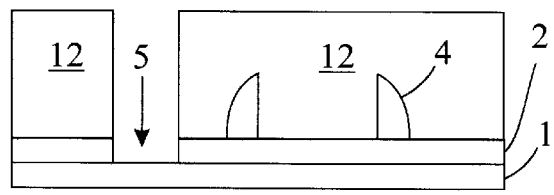
Figure 6B:
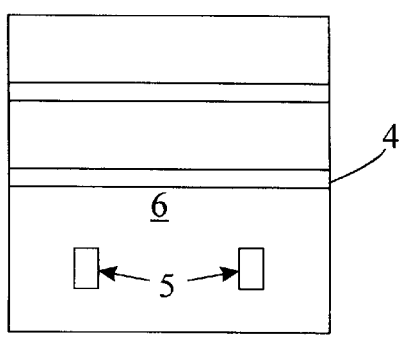
FIGS. 6A and 6B are an illustrative schematic side view and a rotated top view, respectively, showing that a polysilicon layer is deposited on the wafer surface followed by first, blanket, dopant implantation.
Figure 6A:
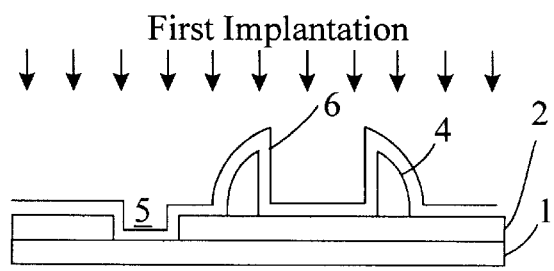

FIGS. 5A and 5B show that a pair of vials 5 are formed through the interpoly dielectric layer 2 using a masked etching procedure utilizing a photoresist 12. After the removal of the photoresist 12, a polysilicon layer 6 is deposited on the wafer surface, as shown in FIGS. 6A and 6B. FIGS. 7A and 7B show that a connector region and a load region, to be identified later, are formed from the polysilicon layer 6 using a photolithography technique. The load region is patterned in a direction perpendicular to the second oxide stripe and conformed to the profile of the second oxide stripe so as to assume a three-dimensional structure and provide an enhanced effective length. The polysilicon layer can be undoped or lightly doped by means of a first, blanket, implantation as shown in FIG. 7A.

FIGS. 8A and 8B show that a second, masked, dopant implantation is performed using a photoresist which covers the load region so as to impart electrical conductivity only to the connector region. The load region is not doped to retain high resistivity.

FIGS. 9A and 9B are an illustrative schematic side view and a rotated top view, respectively, showing the SRAM 10 of the present invention having a double-heaved load device 11 for enhanced effective length and thus enhanced load resistance. The connector region 9 is highly doped to provide high conductivity. The heaved portions of the load device can effectively minimize the effect of out-diffusion of dopant molecules from the highly doped connector region which can significantly reduce the resistance of the load device if the length of the load device is not long enough.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a load device on an SRAM (Static Random Access Memory), comprising the steps of:
    (a) depositing an interpoly dielectric layer on a wafer surface;
    (b) depositing a first oxide layer on said interpoly dielectric layer;
    (c) using a first photolithography procedure to form at least one first oxide stripe from the interpoly dielectric layer along a first direction;
    (d) depositing a second oxide layer on and around said first oxide stripe, then etching back said second oxide layer to form a second oxide spacer on sidewalls of said first oxide stripe;
    (e) using a selective etching technique to etch said first oxide stripe, leaving said second oxide spacer on the wafer surface in the form of a generally elongated bump;
    (f) using a second photolithography procedure to form a polysilicon layer on the wafer surface, wherein said polysilicon layer contains a connector region and a load region, and said load region is patterned in an elongated manner along a second direction generally perpendicular to said first direction and is conformed to a profile of said second oxide stripe so as to assume a three-dimensional heaved structure and provide an enhanced effective length.

2. The method for fabricating a load device on an SRAM according to claim 1 which further comprises the step of dopant-implanting said connector region of said polysilicon layer under a photomask which covers said load region.

3. The method for fabricating a load device on an SRAM according to claim 1 which further comprises the step of dopant-implanting said polysilicon layer before said second photolithography procedure.

4. The method for fabricating a load device on an SRAM according to claim 1 which further comprises the step of forming one or more vials through said interpoly dielectric layer using a photomasked etching procedure before said second photolithography procedure.

5. The method for fabricating a load device on an SRAM according to claim 1 wherein said first oxide layer is a doped BP-TEOS layer, said second oxide layer is an undoped TEOS layer.

6. The method for fabricating a load device on an SRAM according to claim 1 wherein said second oxide layer has a thickness determined based on a required resistance of said load region.

7. The method for fabricating a load device on an SRAM according to claim 1 wherein said second oxide layer has a thickness between about 500 and 2,000 Å.

8. A method for fabricating SRAM (Static Random Access Memory) cells containing a load device separating respective connectors, said method comprising the steps of:
    (a) depositing an interpoly dielectric layer on a wafer surface;
    (b) depositing a first oxide layer on said interpoly dielectric layer;

(c) using a first photolithography procedure to form at least one first oxide stripe from the interpoly dielectric layer along a first direction;

(d) depositing a second oxide layer on and around said first oxide stripe, then etching back said second oxide layer to form at least one second oxide spacer on sidewalls of said first oxide stripe;

(e) using a selective etching technique to etch said first oxide stripe, leaving said second oxide spacer on the wafer surface in the form of a generally elongated bump;

(f) using a second photolithography procedure to form a polysilicon layer on the wafer surface, wherein said polysilicon layer contains a connector region and a load region, and said load region is patterned in an elongated manner along a second direction generally perpendicular to said first direction and is conformed to a profile of said second oxide stripe so as to assume a three-dimensional heaved structure and provide an enhanced effective length.

9. The method for fabricating SRAM cells according to claim 8 which further comprises the step of dopant-implanting said connector region of said polysilicon layer under a photomask.

10. The method for fabricating SRAM cells according to claim 8 which further comprises the step of dopant-implanting said polysilicon layer before said second photolithography procedure.

11. The method for fabricating SRAM cells according to claim 8 which further comprises the step of forming one or more vials through said interpoly dielectric layer before said second photolithography procedure.

12. The method for fabricating SRAM cells according to claim 8 wherein said first oxide layer is a doped BP-TEOS layer, said second oxide layer is an undoped TEOS layer.

13. The method for fabricating SRAM cells according to claim 8 wherein said second oxide layer has a thickness determined by a required resistance of said load region.

14. The method for fabricating SRAM cells according to claim 8 wherein said second oxide layer has a thickness between about 500 and 2,000 Å.

* * * * *